(12) United States Patent
Green et al.

(10) Patent No.: US 6,403,408 B1
(45) Date of Patent: Jun. 11, 2002

(54) THIN-FILM TRANSISTORS AND METHOD FOR PRODUCING THE SAME

(75) Inventors: Peter W. Green, Reigate; Martin J. Powell, Horley, both of (GB)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/644,154

(22) Filed: Aug. 23, 2000

(30) Foreign Application Priority Data

Aug. 24, 1999 (GB) .............................................. 9919913

(51) Int. Cl.[7] .......................... H01L 21/00; H01L 21/84
(52) U.S. Cl. ....................................... 438/161; 438/164
(58) Field of Search ................................ 438/149, 160, 438/158, 161, 164

(56) References Cited

U.S. PATENT DOCUMENTS

| | | | | |
|---|---|---|---|---|
| 5,123,847 A | * | 6/1992 | Holmberg et al. | 148/149 |
| 5,156,986 A | | 10/1992 | Wei et al. | 437/40 |
| 5,441,905 A | | 8/1995 | Wu | 437/41 |
| 5,726,077 A | | 3/1998 | Kawahata et al. | 438/30 |
| 5,733,804 A | | 3/1998 | Hack et al. | 438/158 |
| 5,736,751 A | | 4/1998 | Mano et al. | 257/66 |
| 6,008,065 A | * | 12/1999 | Lee et al. | 438/30 |
| 6,180,438 B1 | * | 1/2001 | Deane et al. | 438/149 |

FOREIGN PATENT DOCUMENTS

| | | | | |
|---|---|---|---|---|
| EP | 0314344 A1 | 5/1989 | .......... | H01L/21/84 |
| EP | 0911872 A3 | 4/1999 | .......... | H01L/21/336 |
| EP | 0911872 A2 | 4/1999 | .......... | H01L/21/336 |

* cited by examiner

*Primary Examiner*—Long Pham
*Assistant Examiner*—William David Coleman
(74) *Attorney, Agent, or Firm*—Aaron Waxler

(57) ABSTRACT

A method of forming a thin film transistor comprises providing first electrode layers (42) over a transparent substrate (40), the first electrode layers comprising a lower transparent layer (42a), and an upper opaque layer (42b). The first electrode layers are patterned to define a first electrode pattern in which an edge region of the transparent layer (42a) extends beyond an edge region of the opaque layer (42b). A transistor body region comprising a semiconductor layer (16) defining the channel area of the transistor and a gate insulator layer (18) is provided over the first electrode pattern (42). A transparent second electrode layer (46) is also provided. A negative resist (70) is exposed through the substrate (40), with regions of the negative resist layer (70) shadowed by the opaque layer (42b) of the first electrode pattern (42) remaining unexposed. These regions and the underlying second electrode layer (46) are removed to define a second electrode pattern which is substantially aligned with the opaque layer (42b) of the first electrode pattern (42).

The method can be used for top or bottom gate TFTs and provides a self aligned gate structure with overlap between the source/drain and the gate, so that no additional processing of the semiconductor body is required.

11 Claims, 8 Drawing Sheets

THIN-FILM TRANSISTORS AND METHOD FOR PRODUCING THE SAME

BACKGROUND OF THE INVENTION

This invention relates to thin-film transistors and to methods for producing the same. More particularly, the invention relates to staggered thin film transistors and production methods for such transistors, having self-aligned gate structures with an overlap between the gate and the source and drain electrodes. Such thin-film transistors are suitable for use in flat panel display devices, for example active-matrix liquid-crystal displays, or in other large-area electronic devices.

Various methods have been proposed for defining self-aligned gate structures in thin film transistors. In some of these methods, the gate conductor has a width which is smaller than the spacing between the source and drain electrodes. This provides some freedom in the positioning of the insulated gate structure with respect to the source and drain electrode structure. However, the regions of the semiconductor body of the transistor between the gate and source/drain electrodes then require treatment to reduce the transistor contact resistances. Various processes have been proposed for this purpose. Typically, these processes involve laser crystallisation and/or ion implatation of those regions of the semiconductor layer. The gate structure plays a part in these processes to maintain the self-aligned property.

This additional treatment adds processing steps and thereby increases the complexity of the manufacturing process. It has been recognised that the need or treatment of the semiconductor layer to reduce the resistance can be avoided if an overlap is provided between the gate electrode and the source and drain electrodes. In this way, the gate modulates the full semiconductor channel area. However, the degree of overlap dictates the capacitance between the gate and the source and drain electrodes, which in turn influences the transistor switching characteristics. When thin film transistors are used in array devices, uniformity of the transistor response characteristics is critical, and consequently the degree of overlap needs to be accurately controllable.

One proposed method for providing a self-aligned thin film transistor with an overlap provided between the gate conductor and the source and drain conductors involves the use of through-the-substrate exposure of a photoresist layer. For example, in the case of a top gate structure, UV light passes through the opening between the opaque source and drain regions and diffracts and scatters through the structure before reaching the photoresist layer. This results in some gate to source/drain overlap, so that the full channel width is modulated by the gate conductor patterned using the selectively exposed resist layer. However, the degree of overlap of the gate conductor with respect to the source and drain conductors is not accurately controllable and may not be sufficient to provide satisfactory operating characteristics of the thin film transistor.

SUMMARY OF THE INVENTION

U.S. Pat. No. 5,156,986 describes a bottom-gate transistor configuration in which the source and drain electrodes are self-aligned with the gate electrode, but overlap the edges of the gate. One proposed method in U.S. Pat. No. 5,156,986 for achieving this involves the use of through-the-substrate exposure of a positive photoresist layer to enable a masking plug to be formed prior to deposition of the top source and drain electrode layers. A two-layer gate conductor is disclosed comprising a transparent layer and an opaque layer, with the opaque layer only being used to define the shape of the masking plug. The spacing between the source and drain electrodes is eventually defined by a non-selective uniform etching of the entire structure, until the source/drain metallisation is exposed over the masking plug, as a result of its greater height in that region. The spacing between the gate and source of this structure is therefore determined by the contours of the various layers defining the entire structure, and also depends upon the exact point at which the non-selective etching is halted. Consequently, device characteristics may vary between different transistors depending upon local variations in these parameters.

The present invention provides a method of forming a thin film transistor comprising:

providing first electrode layers over a transparent substrate, the first electrode layers comprising a lower transparent layer, and an upper opaque layer;

patterning the first electrode layers to define a first electrode pattern in which an edge region of the transparent layer extends beyond an edge region of the opaque layer;

providing a transistor body comprising a semiconductor layer defining the channel area of the transistor and a gate insulator layer;

providing a transparent second electrode layer;

providing a layer of negative resist over the second electrode layer;

exposing the layer of negative resist through the substrate such that regions of the negative resist layer shadowed by the opaque layer of the first electrode pattern remain unexposed; and removing the unexposed negative resist and the underlying second electrode layer to define a second electrode pattern which is substantially aligned with the opaque layer of the first electrode pattern.

In addition, according to the present invention there is provided a method of forming a thin film transistor comprising:

providing first electrode layers over a transparent substrate, the first electrode layers comprising a lower transparent layer, and an upper opaque layer;

patterning the first electrode layers to define a first electrode pattern in which an edge region of the transparent layer extends beyond an edge region of the opaque layer;

providing a transistor body region over the first electrode pattern, the transistor body region comprising a semiconductor layer defining the channel area of the transistor and a gate insulator layer;

providing a transparent second electrode layer over the transistor body region;

providing a layer of negative resist over the second electrode layer;

exposing the layer of negative resist through the substrate such that regions of the negative resist layer shadowed by the opaque layer of the first electrode pattern remain unexposed;

removing the unexposed negative resist and the underlying second electrode layer to define a second electrode pattern which is substantially aligned with the opaque layer of the first electrode pattern.

The method of the invention uses through-the-substrate exposure of negative resist in order to define the subsequent patterning of the upper electrode layer of the transistor structure. The exposure of the negative resist layer depends upon the shape of the opaque layer of the lower, first electrode layers. The transparent layer of the lower, first electrode layers ensures that there is overlap between the gate conductor and the source and drain conductors of the transistor.

The method may be employed for forming a bottom gate or top gate thin film transistor. One of the first and second electrode layers will define the gate conductor, and the other will define the source and drain electrode pattern. A channel etched or etch stop structure may be defined. Furthermore, coplanar bottom or top gated structures may be formed.

Patterning of the first electrode layers preferably comprises etching, for example wet etching, using an etchant which etches the lower transparent layer and the upper opaque layer at different rates. The etching time may then be selected to produce a desired degree of overlap by which the edge region of the transparent layer extends beyond the edge region of the opaque layer. This degree of overlap in turn determines the overlap of the source and drain electrodes with respect to the gate electrode, and thereby determines the operating characteristics of the transistor.

The invention also provides a thin film transistor comprising:

a first electrode pattern provided over a substrate, the first electrode pattern comprising a lower transparent layer, and an upper opaque layer, an edge region of the transparent layer extending beyond an edge region of the opaque layer; a transistor body comprising a semiconductor layer defining the channel area of the transistor and a gate insulator layer; and a transparent second electrode pattern substantially aligned with the opaque layer of the first electrode pattern.

Furthermore, the present invention provides a thin film transistor comprising:

a first electrode pattern provided over a substrate;

a transistor body region provided over the first electrode pattern, the transistor body region comprising a semiconductor layer defining the channel area of the transistor and a gate insulator layer; and a second electrode pattern over the transistor body region, wherein the first electrode pattern comprises a lower transparent layer, and an upper opaque layer, an edge region of the transparent layer extending beyond an edge region of the opaque layer, in that the second electrode pattern is transparent, and in that the second electrode pattern is substantially aligned with the opaque layer of the first electrode pattern.

The transistor of the invention is suitable for manufacture using the method above. The transistor may be used in an electronic device, for example a liquid crystal display which will include a transistor substrate comprising an array of the thin film transistors.

BRIEF DESCRIPTION OF THE DRAWINGS

Embodiments of the invention will now be described by way of example, with reference to and as shown in the accompanying drawings, in which:

The drawings are not to scale, and the thickness of various layers may have been exaggerated or reduced for the purposes of clarity. The same reference numerals have been used to denote the same layers or transistor features (e.g. source, drain, gate) in different embodiments.

FIG. 1 illustrates how back exposure of a negative photoresist layer may be employed to obtain a fully self-aligned offset thin film transistor structure. The structure shown in FIG. 1 comprises a transparent, for example glass, substrate 10, over which a source and drain electrode pattern 12, 14 is formed. An amorphous silicon layer 16 is provided over the source and drain electrode pattern, and the region of the amorphous silicon layer 16 between the source and drain electrodes 12, 14 defines the semiconductor channel of the transistor. A gate insulator layer 18 is provided over the semiconductor layer 16 and a transparent conducting layer 20, which is to form the gate conductor, is provided over the gate insulator layer 18. A negative resist layer 22 is provided over the structure, and is selectively exposed using UV radiation 24 from beneath the substrate 10.

Figure 2:
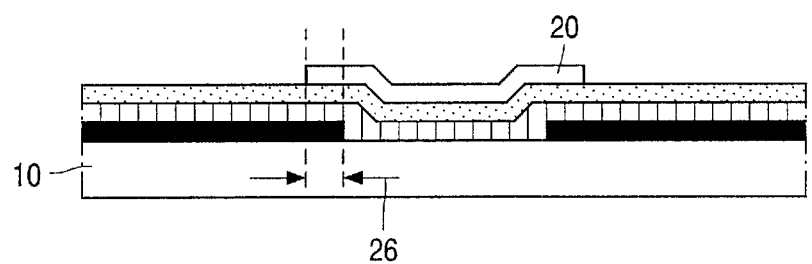
FIG. 2 shows a top gate thin film transistor manufactured using the method explained with reference to FIG. 1.

The source and drain pattern 12, 14 shields the UV light 24, so that the passage of light through the transistor structure only takes place in the spacing between the source and drain electrodes. The UV light 24 diffracts and scatters as it passes through this opening, and results in source/drain overlap. Thus, the exposed region of the resist layer 22 is wider than the spacing between the source and drain electrodes 12, 14. This exposed region dictates the subsequent patterning of the gate electrode layer 20, and the structure shown in FIG. 2 results. The overlap 26 depends upon the degree of scattering of the UV light 24 and will therefore depend upon the nature and thickness of the various layers forming the structure.

Figure 3:
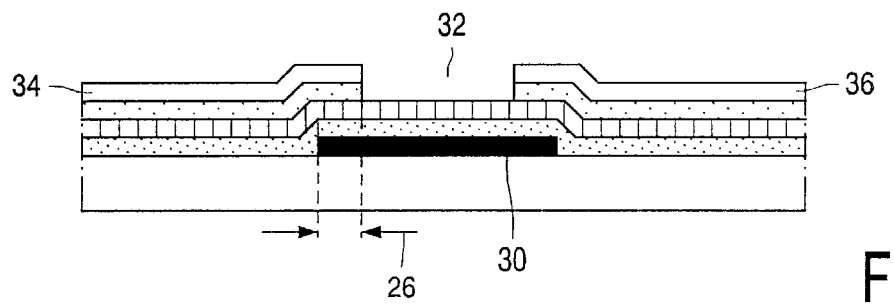
FIG. 3 shows a bottom gate thin film transistor which can be manufactured using through-the-substrate exposure of negative photoresist.

FIG. 3 illustrates a bottom gate thin film transistor structure which can be produced using a similar approach, with exposure of negative photoresist in regions not shielded by the lower gate conductor 30. The exposed photoresist determines the subsequent patterning of the spacing 32 between the source and drain electrodes 34, 36. Again, the degree of source/drain to gate overlap 26 may not be sufficient (it is exaggerated in FIGS. 2 and 3) or may not be accurately repeatable to give rise to uniform device characteristics over a substrate carrying an array of the transistors.

Figure 4A:
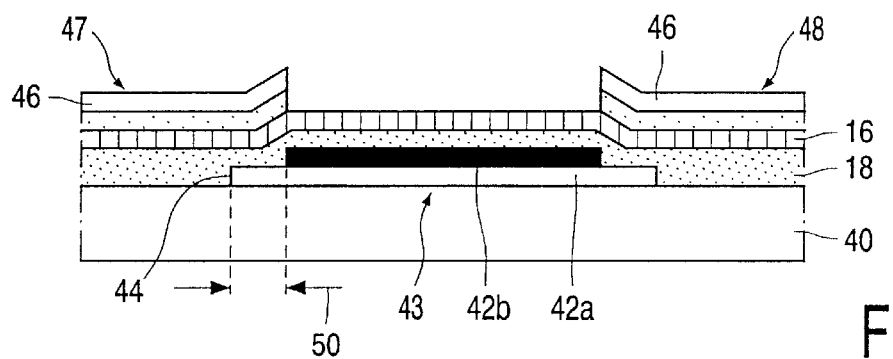
FIG. 4A shows a channel etched bottom gate thin film transistor according to the invention.

FIG. 4A illustrates a bottom gate thin film transistor manufactured according to the method of the invention, and which has a more accurately controllable degree of overlap between the source and drain electrodes and the gate electrode.

Figure 1:
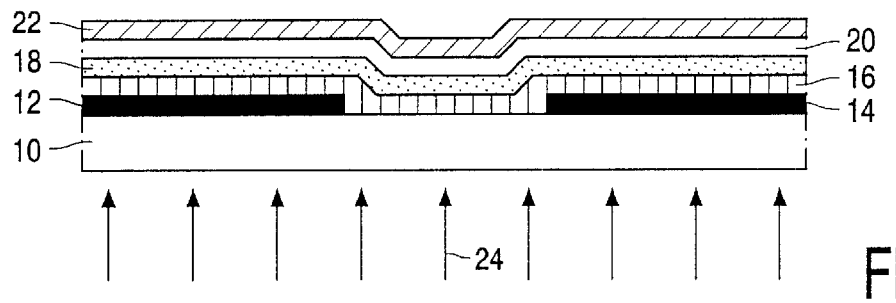
FIG. 1 shows the possible use of through-the-substrate exposure of a resist layer to define a transistor with overlap between the source/drain electrodes and the gate electrode.

The structure shown in FIG. 4A comprises a substrate 40 over which a first electrode pattern 42 is provided, which defines the gate conductor of the transistor. The gate conductor 42 comprises a lower transparent layer 42a and an upper opaque layer 42b. The edge 44 of the transparent layer 42a extends beyond the edge of the opaque layer 42b. Thus, through-the-substrate exposure of a top negative photoresist layer, in the manner represented in FIG. 1, results in the exposed photoresist being substantially aligned with the opaque layer 42b of the gate conductor. The scattering of the UV light, as described above, prevents exact alignment. The exposed photoresist is used to shape a second electrode pattern 46, which defines the source and drain electrodes to be aligned with the opaque layer 42b. Thus, there is a controllable degree of overlap 50 between the gate 43 and the source and drain 47, 48.

Figure 4B:
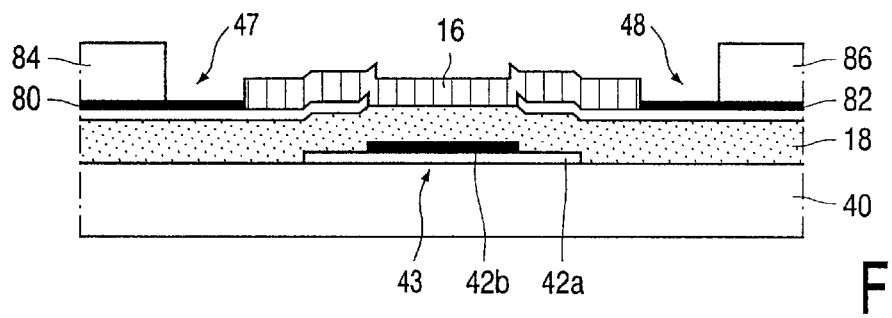
FIG. 4B shows a coplanar bottom gate thin film transistor according to the invention.

FIG. 4B represents a coplanar bottom gate thin film transistor formed using a method of the invention. It primarily differs from the structure of FIG. 4A in that the semiconductor layer 16 is provided above the source and drain electrodes 47, 48. Layers of silicide 80, 82 are also shown between these electrodes, and respective metal source and drain contacts 84 and 86.

The configuration shown in FIG. 4B was developed to address a fabrication issue encountered with the channel etch structure of FIG. 4A. The latter involves exposure of a top negative resist layer through the semiconductor layer 16. Typically, a thickness of the order of 200 nm may be required for the semiconductor layer to reduce interaction between defect state produced on the etched surface of the semiconductor layer and charge carries in the channel region, and also because some of the semiconductor layer will be lost in the etching process. However, the semiconductor layer may have a large optical absorption coefficient at UV wavelengths (approximately $\geq 5 \times 10^5$ cm$^{-1}$), making the formation of this structure using UV back exposure problematic. Use of a photoresist with spectral sensitivity at longer wavelengths than UV may overcome this.

An alternative solution is provided by the structure illustrated in FIG. 4B, which combines the self-aligned aspects of the FIG. 4A embodiment with a coplanar configuration. Back exposure and etching of the source 47 and drain 48 is carried out prior to deposition of the semiconductor layer 16, thereby avoiding absorption of the incident radiation by the semiconductor layer. This approach enables formation of a relatively inexpensive fully self-aligned coplanar configuration. The silicide layers 80, 82 are preferably included to reduce contact resistance between the source 47 and drain 48, and the source and drain contacts 84 and 86.

Figure 5A:
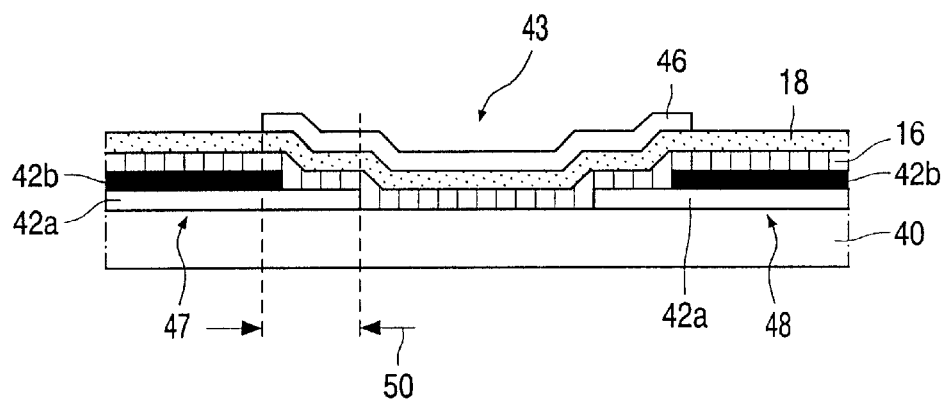
FIG. 5A shows a top gate thin film transistor according to the invention.

FIG. 5A shows a top gate transistor manufactured using a method adopting the same principle as FIGS. 4A and 4B. In this case, the first electrode pattern 42a, 42b defines the source and drain electrodes 47, 48 of the transistor, and the second electrode pattern 46 is patterned using exposure through the substrate 40 to correspond substantially to the spacing between the opaque layers 52b of the source and drain electrodes. The second electrode pattern 46 defines the gate conductor 43.

Figure 5B:
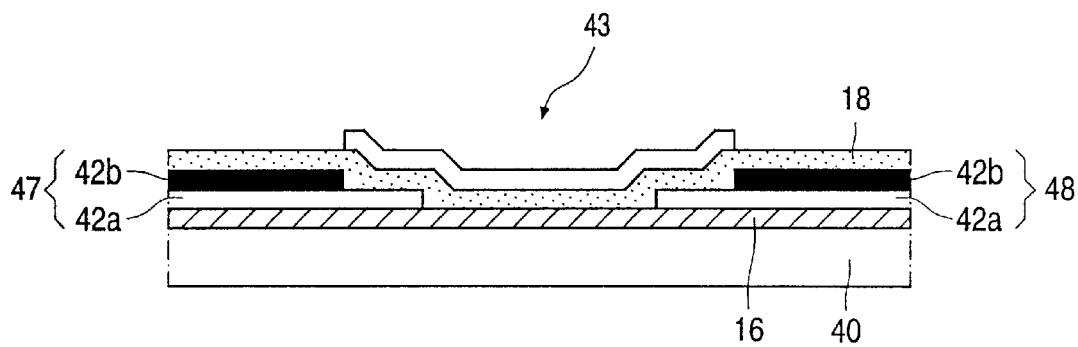
FIG. 5B shows a coplanar top gate thin film transistor according to the invention.

FIG. 5B illustrates a coplanar top gate transistor in accordance with the invention. Its structure is similar to that of the top gate transistor shown in FIG. 5A, except that the semiconductor layer is deposited on the substrate before the source/drain, insulator and gate layers, 47, 48, 18 and 43.

In the examples shown in FIGS. 4A, 4B, 5A and 5B, there will still be some scattering during the exposure of the top resist layer, and this is represented only in FIG. 5A, with the misalignment between the opaque layer 42b and the edge of the gate 43. In each case, the upper electrode layer needs to be transparent to enable exposure through that layer of the overlying resist layer.

Figure 6:
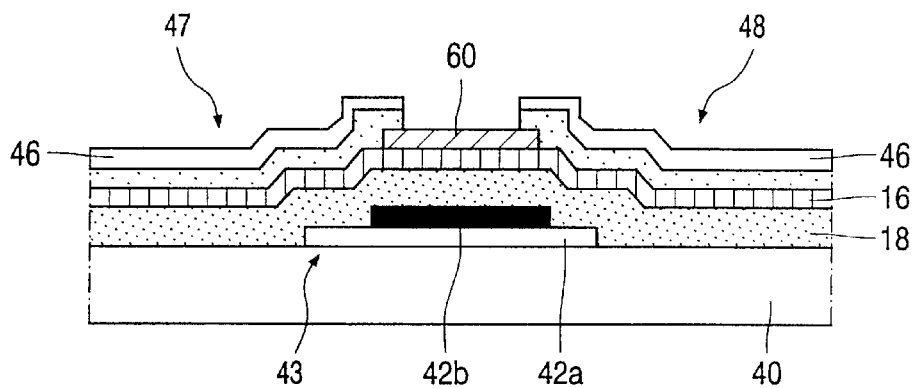
FIG. 6 shows a bottom gate thin film transistor according to the invention with an etch stop.

FIG. 6 illustrates a bottom gate thin film transistor additionally provided with an etch stop layer 60 over the semiconductor layer 16, with the source and drain electrodes 47, 48 overlying the edges of the etch stop layer 60.

The first step required to form the transistor structures shown in FIGS. 4 to 6 is the formation of the first, lower electrode pattern, which is used to define the area of the negative photoresist layer which is exposed, and which in turn defines the patterning of the second, upper electrode pattern.

Figure 7A:
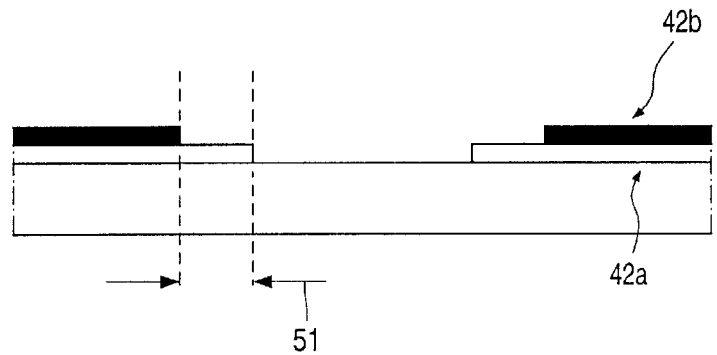
FIG. 7 shows various sequences in the production of source and drain electrodes over a substrate for use in a top gate thin film transistor.

FIG. 7A shows the desired first electrode pattern for a top gate thin film transistor. The edge of the lower, transparent layer 42a is desired to extend beyond the edge of the upper opaque layer 42b by a controllable amount 51.

Figure 7B:
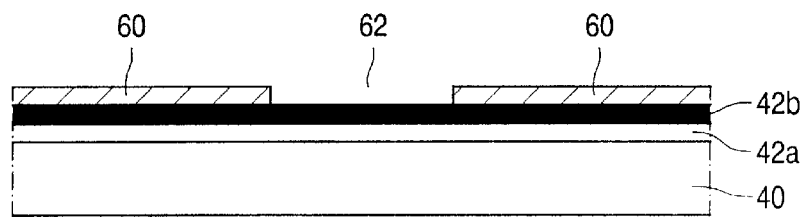

As shown in FIG. 7B the substrate 40 is initially coated with the two layers 42a, 42b. These layers may be deposited in sequence by any appropriate technique such as sputtering, chemical vapour deposition, thermal evaporation and so on. The lower transparent layer 42a may comprise indium tin oxide, or any other transparent conductor. The upper opaque layer 42b may comprise chromium nitride, molybdenum, aluminium or any other suitable metal or alloy. The opaque layer 42b may also, in fact, comprise a number of sub-layers. However, as will become apparent from the following, the etching conditions must be selected taking into consideration the relative etching rates of the layers 42a, 42b, and the use of multiple sub-layers will complicate the etching process.

A mask 60 is provided over the first electrode layers and is patterned to provide an opening 62 to enable etching of the underlying first electrode layers. The mask 60 may be provided by conventional photolithographic techniques using resist layers.

Figure 7C:
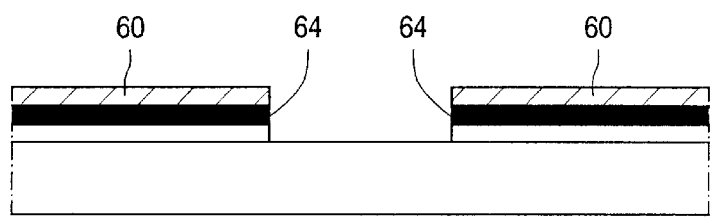
Figure 7D:
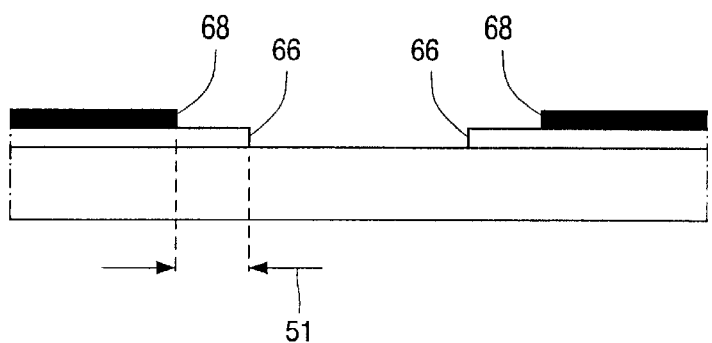

The first electrode layers may be sequentially deposited in the same vacuum conditions. The mask 60 is used for subsequent etching of both layers 42a, 42b using a wet etching process. This wet etching process removes the transparent layer 42a and the opaque layer 42b in the opening 62 as shown in FIG. 7C. However, continuation of the wet etching process results in removal of layer material laterally from the inner wall 64. The selected etchant gives rise to different etching rates for the two layers 42a, 42b, and in particular the opaque layer has a higher etching rate. Consequently, further etching results in a first electrode pattern in which an edge 66 of the transparent layer extends beyond an edge 68 of the opaque layer, as shown in FIG. 7D, in which the mask layer 60 has been removed. The two layers 42a, 42b are, however, aligned to each other.

Figure 8:
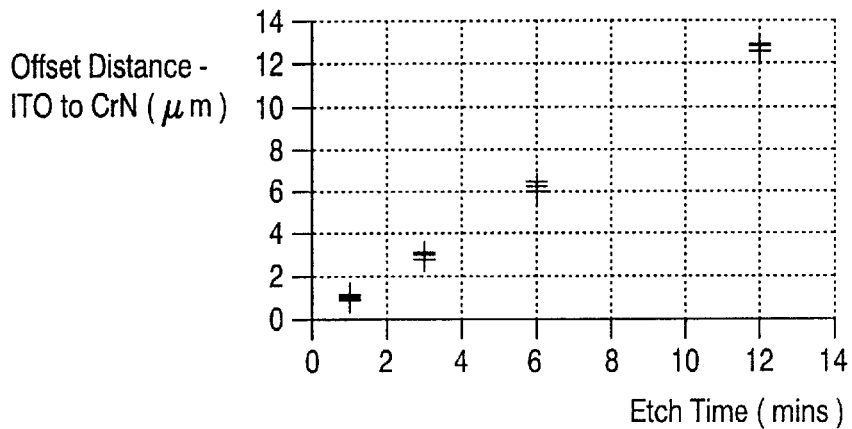
FIG. 8 shows the relationship between etching time and offset distance during the etching process described with reference to FIG. 7.

The offset 51 can be controlled by timing the wet etching process. FIG. 8 shows a typical relationship between the etching time and the offset distance 51 for an ITO transparent layer (for example of thickness 20 to 40 nm) and a CrN opaque layer (for example of thickness 40 to 120 nm) using, as etchant, an aqueous solution of Ammonium Ceric Nitrate and Nitric acid.

FIG. 9 shows the steps required for producing the top gate thin film transistor illustrated in FIG. 5A.

Figure 9A:
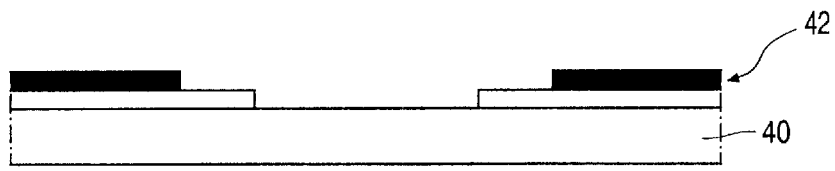
FIG. 9 shows steps for manufacture of a top gate thin film transistor using the substrate prepared with the method shown in FIG. 7.
Figure 9B:
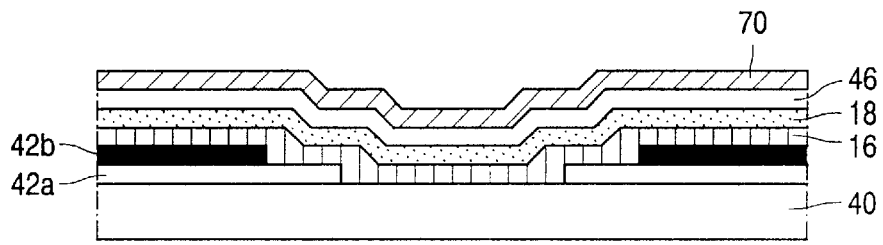

FIG. 9A shows the substrate 40 over which the first electrode pattern 42 is provided, prepared using the steps illustrated in FIG. 7. A semiconductor layer 16 is deposited over the structure shown in FIG. 9A, which defines the channel of the transistor device. The semiconductor layer may comprise amorphous silicon or microcrystalline silicon, depending upon the desired device characteristics. In the case of amorphous silicon, additional processing steps are preferably carried out to improve the contact resistance between the metal layers of the source and drain 47, 48 and the silicon layer. For this purpose, flash doping of phosphine ions into the structure shown in to FIG. 9A may be carried out, so that the implanted phosphine ions subsequently migrate into the amorphous silicon layer to form a doped surface region at the point of contact between the amorphous silicon layer and the source and drain contacts. This technique will be known to those skilled in the art. The semiconductor layer 16 may alternatively comprise microcrystalline silicon, which gives rise to a higher mobility device without introducing significant additional processing complexity. The use of microcrystalline silicon is particularly advantageous in a top gate structure, as the quality of the silicon layer improves as the layer is deposited, so that a higher quality layer is present in the region of the gate of the transistor. As a further alternative, a polycrystalline silicon layer may be formed, for example by depositing an amorphous silicon layer and performing a subsequent laser annealing process.

A gate dielectric layer 18 is deposited over the entire structure, preferably by chemical vapour deposition, to produce a high integrity dielectric. The dielectric is preferably silicon nitride, but may be silicon dioxide or other dielectrics.

The upper, second electrode layer 46, which is to define the gate of the transistor, overlies the dielectric layer 18 and is a transparent layer, for example of indium tin oxide.

Finally, the layer of negative resist 70 is deposited in conventional manner, and is exposed using ultraviolet radiation from the opposite side of the substrate 40.

The transparent layer 42a of the first electrode layer allows the passage of the UV radiation, whereas the opaque layer 42b shields that radiation. In this description, and the claims, the reference to a "transparent" layer indeed indicates the transparency of the layer to the radiation selected for exposure of the negative resist layer 70. The layers forming the structure of the transistor will, of course, not be 100% transparent, but they will result in some absorption and reflection of the radiation signal. The term "transparent" is therefore intended to indicate only that the layers of the structure are sufficiently transparent to enable the selective exposure of the negative resist layer 70 to enable the correct use of the photoresist for subsequent processing of the structure.

Figure 9C:
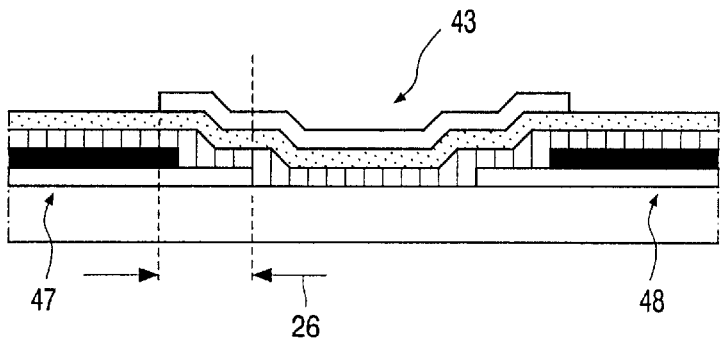

The exposure of the negative resist layer 70 results in an exposed area corresponding substantially to the spacing between the opaque layer 42a of the source and drain areas 47, 48. The scattering described in relation to FIGS. 1–3 will result in the exposed region of the resist layer 70 being slightly greater than the spacing referred to above. However, the level of overlap 26 between the gate 43 and the source and drain 47, 48 will be much more accurately controllable, and the variations in the level of overlap resulting from unpredictable scattering effects will be less important compared to the accurately controllable overlap between the layers 42a, 42b defining the first electrode pattern. FIG. 9C shows the resulting structure when the exposed negative resist layer 70 is used as a mask during etching of the second electrode layer 46. The structure shown in FIG. 9C corresponds to that shown in FIG. 5A. It will be appreciated that as noted above, a procedure similar to that for forming the transistor of FIG. 5A as described in relation to FIGS. 9A to C can be readily altered to fabricate the coplanar structure of FIG. 5B by changing the order of steps such that the semiconductor layer 16 is deposited over the substrate below the source and drain layers 47, 48.

FIG. 10 shows the processing steps required to form the bottom gate back channel etched structure illustrated in FIG. 4A.

Figure 10A:
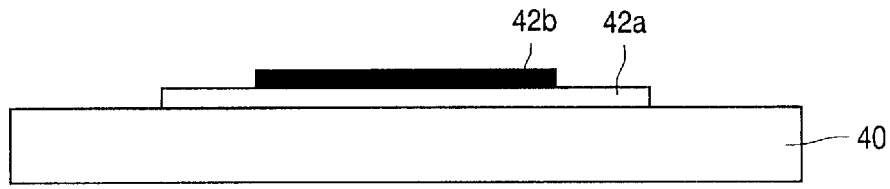
FIG. 10 shows steps for forming a bottom gate thin film transistor of the invention.

As shown in FIG. 10A the layers 42a and 42b are deposited over the substrate 40 and patterned to define the central gate conductor of the transistor device.

Figure 10B:
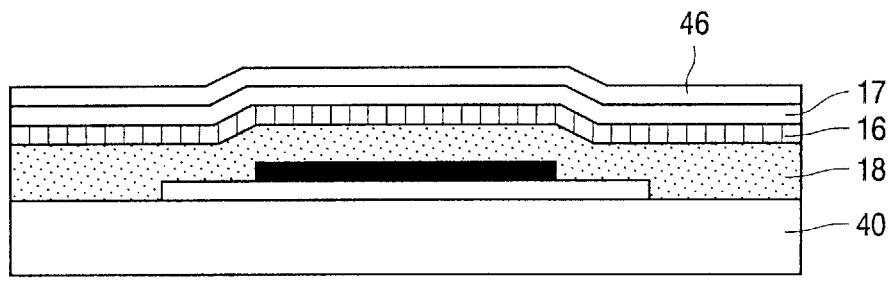
Figure 10C:
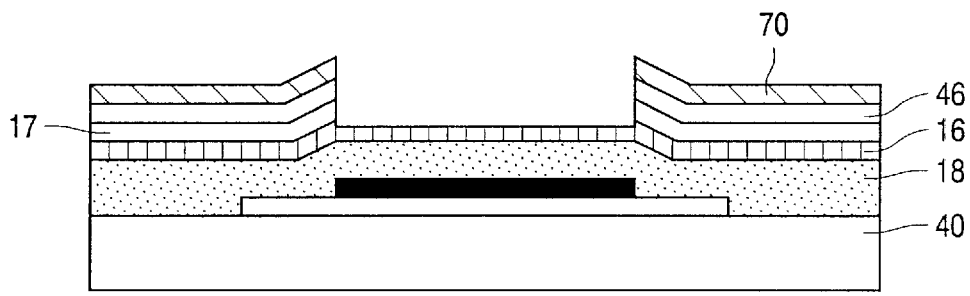

The gate insulator 18 and the semiconductor layer 16 are deposited over the structure shown in FIG. 10A. In the case of amorphous silicon used as the semiconductor layer, a further, thinner, layer of doped amorphous silicon 17 is then deposited on the intrinsic amorphous silicon, which again is provided for reducing the contact resistance between the source and drain contacts and the amorphous silicon body of the transistor. The transparent second electrode layer 46 overlies the doped amorphous silicon layer 17 as shown in FIG. 10B.

In similar manner to that described with reference to FIG. 9, a layer of negative resist is provided over the resulting structure, and this is exposed through the substrate with the opaque layer 42b of the first electrode pattern acting as a shield. Subsequent removal of the unexposed negative photo resist 70 and etching of the underlying second electrode layer 46, and the underlying doped amorphous silicon layer 17, results in the structure shown in FIG. 10C. The etching conditions may be selected to etch partially into the upper surface of the amorphous silicon layer 16 to form a back channel etched structure, as shown, to ensure that all of the doped amorphous silicon layer 17 is removed in that area of the structure.

Figure 10D:
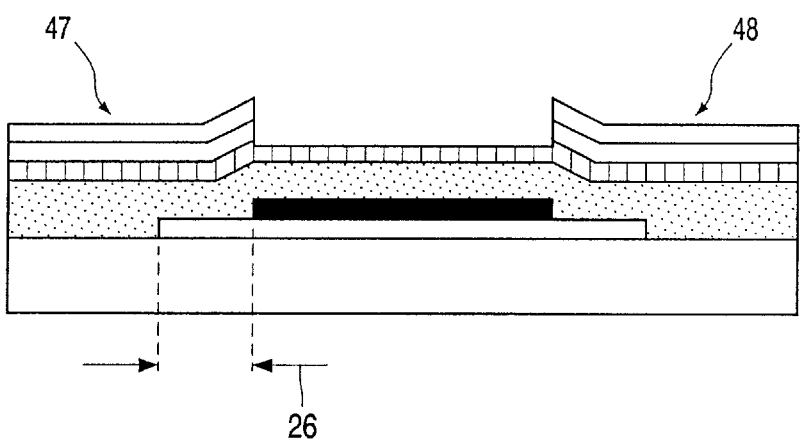

FIG. 10D shows the resulting structure once the photoresist layer has been removed. Again, the overlap 26 is accurately controllable depending upon the processing of the first electrode pattern to give rise to the structure shown in FIG. 10A.

FIG. 11 illustrates steps involved in the fabrication of the coplanar bottom gate transistor shown in FIG. 4B.

Figure 11A:
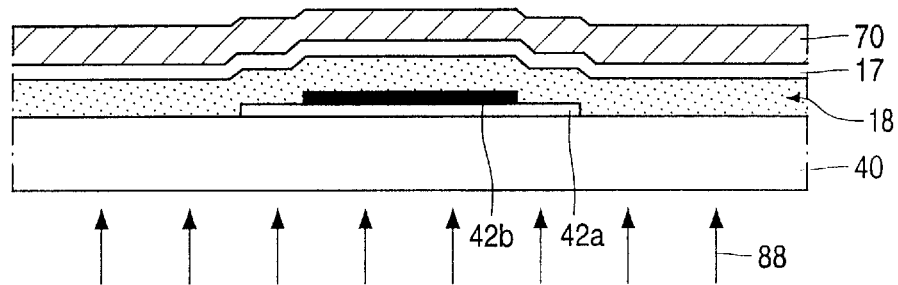
FIG. 11 shows steps for forming the coplanar bottom gate thin film transistor of FIG. 4B.
Figure 11B:
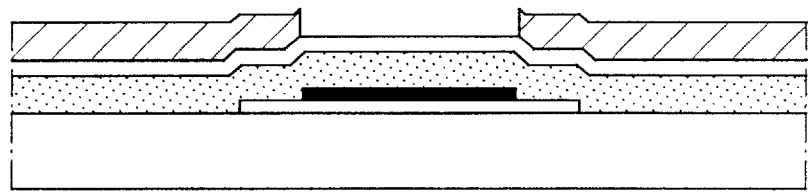

Initially, as in the process shown in FIG. 10, electrode layers 42a and 42b are deposited over the substrate 40 and patterned to define the central bottom gate of the transistor. A gate insulator layer 18 which comprises silicon nitride for example is then deposited over the gate electrode. Next, in contrast to the FIG. 10 process, the layer of doped amorphous silicon 17 is deposited, followed by a layer of negative photoresist 70 (see FIG. 11A). The doped layer may be relatively thin, that is, around 30 to 50 nm. The back of the substrate 40 is then irradiated with UV light 88. The photoresist shadowed by the opaque gate electrode 42b is removed as shown in FIG. 11B.

Figure 11C:
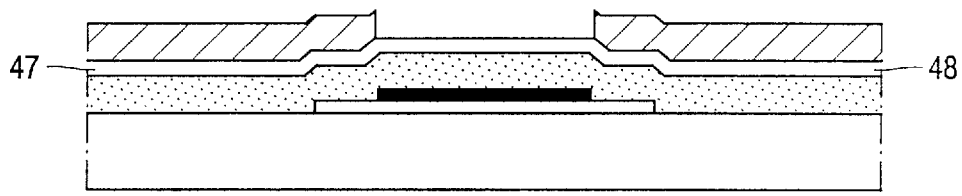
Figure 11D:
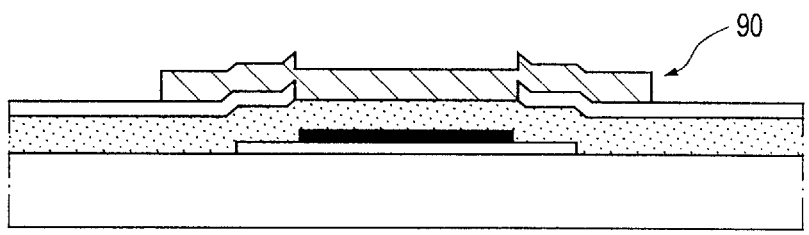
Figure 11E:
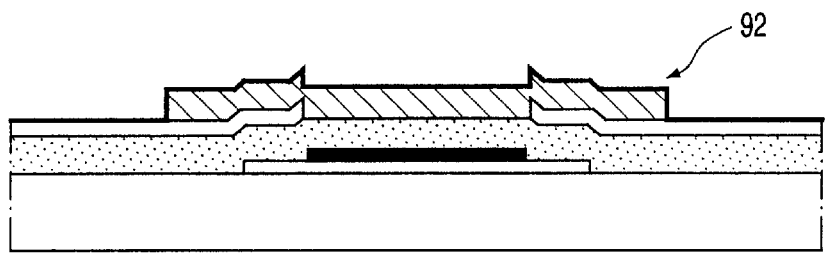

As shown in FIG. 11C, the doped silicon layer 17 is then etched away where exposed. Wet or dry etching may be employed. In the latter case, the etch recipe should have a high amorphous silicon to silicon nitride selectivity. An example of a suitable wet etchant is potassium hydroxide with isopropyl alcohol.

Figure 11F:
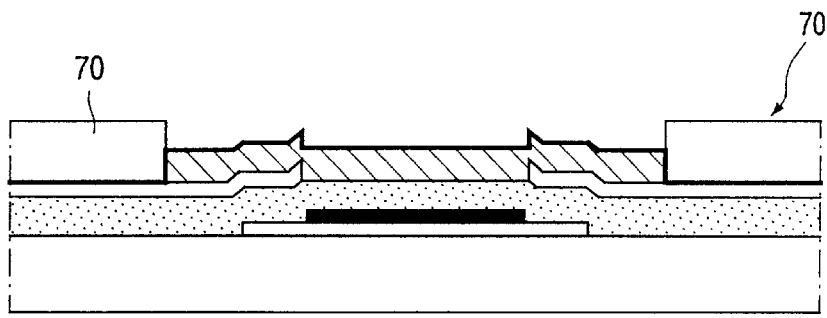
Figure 11G:
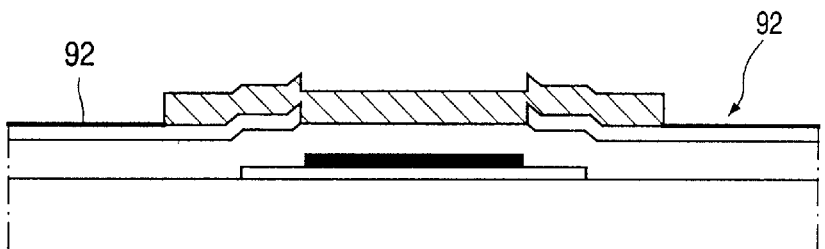
Figure 11H:
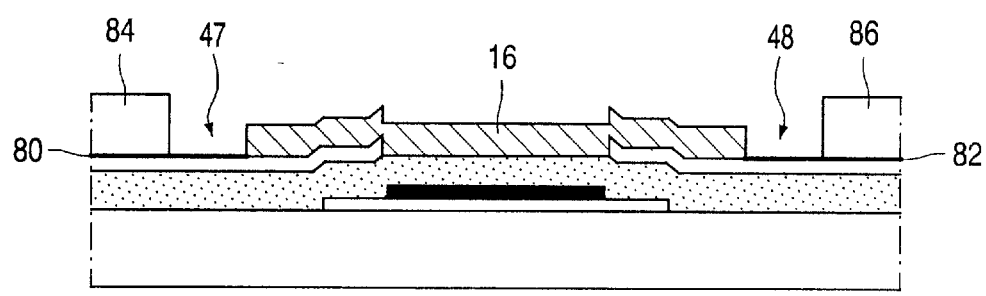

Subsequently, a layer of intrinsic amorphous silicon is deposited and patterned to form an island 90 which overlaps the source and drain 47, 48. A silicide layer 92 is deposited over the resulting structure. A second UV back exposure is then performed to remove the silicide from the semiconductor island 90. A negative photoresist layer is applied and irradiated with UV, using the opaque gate 42b, and the combined thickness of the overlapping portions of the electrodes 47, 48 and the semiconductor island 90 as a shield. The unexposed photoresist is then etched away, as shown in FIG. 11F. Next, the exposed silicide 92 is etched away, and the remaining photoresist 70 then removed to leave silicide over the source and drain 47, 48 (FIG. 11G). Finally, source and drain contacts 84, 86 are formed as shown in FIG. 11H to complete the device structure. As noted above, inclusion of a silicide layer between the source and drain electrodes 47, 48 and their respective contacts 84, 86 helps to reduce contact resistance in the transistor.

FIG. 12 shows the steps required to form the etch stop bottom gate transistor shown in FIG. 6.

Figure 12A:
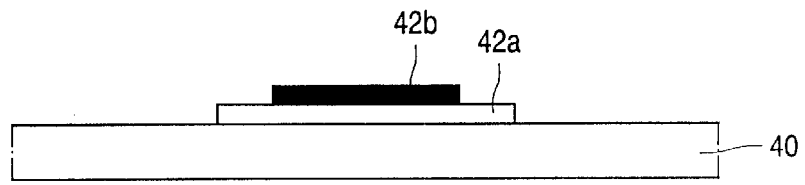
FIG. 12 shows steps for forming a bottom gate thin film transistor according to the invention with an etch stop layer.
Figure 12B:
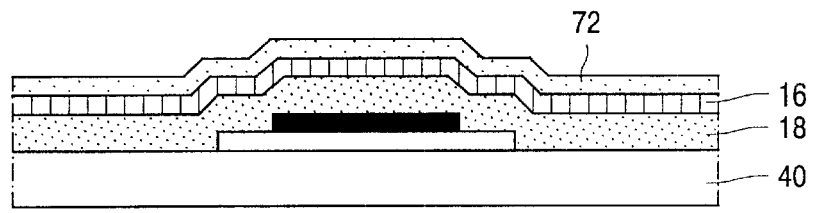

The starting point for the structure is the first electrode pattern which defines the gate electrode. Thus, FIG. 12A corresponds to FIG. 10A. Subsequently, the gate dielectric 18, and the semiconductor layer 16 are formed over the structure, followed by the insulator layer 72 which is to form the etch stop, as shown in FIG. 12b. The insulator layer 72 may comprise silicon nitride.

The etch stop layer 72 is then patterned, using back exposure of a positive resist layer 74 provided over the structure shown in FIG. 12B, for example by spinning. The back exposure results in shielding of the area of the positive resist layer 74 overlying the opaque layer 42b, and subsequent removal of the exposed positive resist and the underlying insulator layer 72 results in the structure shown in FIG. 12C. Thus, the etch stop layer is self-aligned with the opaque part of the gate 43.

Figure 12C:
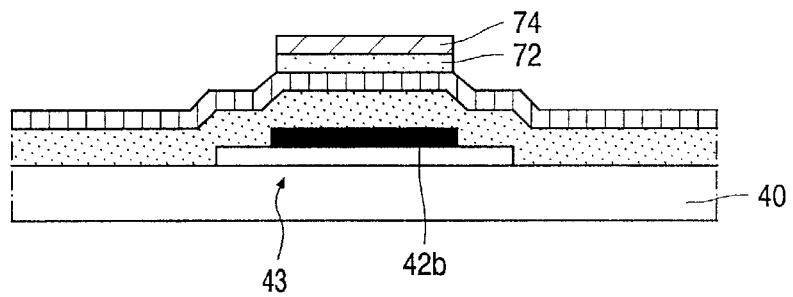

A doped amorphous silicon layer 17 is provided over the structure shown in FIG. 12C on top of which is provided the second electrode layer 46. Exposure of a negative resist layer with shielding by the opaque layer 42b result in the structure shown in FIG. 12D, in which the source and drain electrodes 47, 48 overly the etch stop 60 as a result of the scattering effect.

Figure 12D:
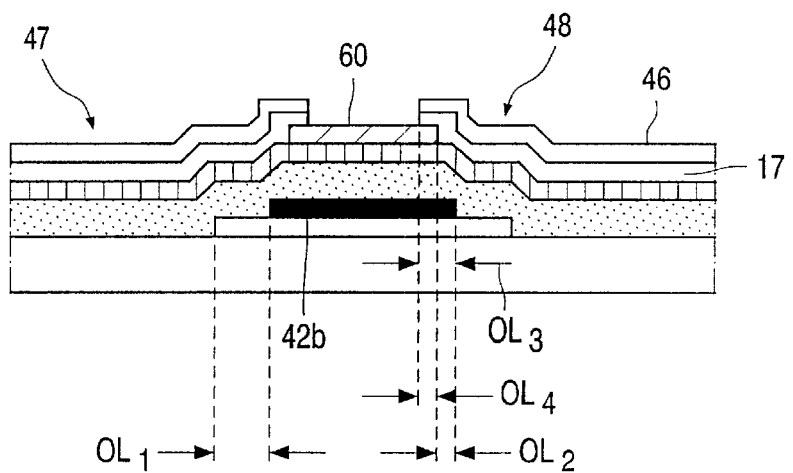

The processing of the etch stop device shown in FIG. 12D involves two exposures through the substrate of resist layers. This results in four different overlap regions $OL_1$–$OL_4$. The overlap $OL_1$ is that determined during the processing of the first electrode pattern, as explained with reference to FIG. 7. Back exposure of the positive resist 74 to form the etch stop 60 results in the insulator layer 72 defining the etch stop being smaller than the opaque layer 42b of the gate 43 by an amount $OL_2$. Back exposure to form the transparent source and drain contacts, using negative resist, will produce the overlap $OL_3$, which is greater than $OL_2$ as a result of the increased scattering through the thicker overall structure. This is required for the etch stop to work, because an overlap $OL_4$ is needed by which the source and drain electrodes 47, 48 overly the edges of the etch stop 60.

It is desirable to have the overlap $OL_2$ as small as possible. This can be achieved by using the minimum back exposure dose to self-align the etch stop insulator layer 72. In addition, the exposure dose used to self-align the source and drain contacts should be larger than the minimum required, so as to ensure that $OL_4$ is positive. Clearly, there is a smaller process window for fabrication of the bottom gate etch stop design than the processes described with reference to FIGS. 9 to 11.

From reading the present disclosure, many variations and modifications will be apparent to persons skilled in the art. Such variations and modifications may involve other materials, other processes and other device features that are already known in the design, manufacture and use of thin film transistors. Thus, for example, in a bottom gate embodiment, the second electrode layer 46 that provides the electrodes 47 and 48 (aligned with gate part 42b) may comprise a transparent thin silicide layer or indium tin oxide (ITO), for example. The doped layer 17 of a bottom gate transistor may be of amorphous silicon, or it may be of doped polycrystalline or microcrystalline silicon. The use of polycrystalline or microcrystalline silicon for the layer 17, instead of amorphous silicon, permits a lower contact resistance with the source and drain electrodes 47 and 48. When the source and drain electrodes 47 and 48 comprise a thin silicide, additional thicker metallisation of aluminium (for example) may be provided as connections to these electrodes 47 and 48 at opposite ends of the transistor.

Various additional processing steps may be required depending on the particular nature of the materials selected for forming the transistor structure. For example, in the case of a top gate structure, the processes described above only result in the formation of a gate electrode, and do not provide the connections to or between these gates. Further deposition and patterning steps are required for this purpose. In the case of a bottom gate structure, the processes described above do not remove the connections between the source and drain outside the area of the transistor. Further patterning of the layer defining the source and drain electrodes is required for this purpose.

Although not shown in the drawings, the first electrode structure may be tapered, to prevent step coverage problems. For the bottom gate TFT, this would mean tapering both the transparent and the opaque layer, whereas for the top gate TFT, tapering of only the transparent layer could be sufficient. A variety of ways of producing a tapered structure will be apparent to those skilled in the art.

A wet etching process has been described for the etching of the first electrode layer to produce the controllable overlap. However, a dry etching process may equally be applicable, which may be isotropic or anisotropic depending on the plasma conditions and gases used.

The specific considerations for the practical manufacture of thin film transistors will be apparent to those skilled in the art, and the considerations which should be applied for existing transistor designs should also be applied for design of a transistor in accordance with the invention. The precise process conditions which may be appropriate have not been described in this text, as this is a matter of normal design procedure for those skilled in the art.

What is claimed is:

1. A method of forming a thin film transistor comprising:
   providing first electrode layers over a transparent substrate, the first electrode layers comprising a lower transparent layer, and an upper opaque layer;
   patterning the first electrode layers to define a first electrode pattern in which an edge region of the transparent layer extends beyond an edge region of the opaque layer;
   providing a transistor body comprising a semiconductor layer defining the channel area of the transistor and a gate insulator layer;
   providing an upper transparent second electrode layer;
   providing a layer of negative resist over the second electrode layer;
   exposing the layer of negative resist through the substrate such that regions of the negative resist layer shadowed by the opaque layer of the first electrode pattern remain unexposed; and removing the unexposed negative resist and the underlying second electrode layer to define a second electrode pattern which is substantially aligned with the opaque layer of the first electrode pattern.

2. A method as claimed in claim 1, wherein the patterning of the first electrode layers comprises etching using an etchant which etches the lower transparent layer and the upper opaque layer at different rates.

3. A method as claimed in claim 2, wherein an etching time is selected to produce a desired degree of overlap by which the edge region of the transparent layer extends beyond the edge region of the opaque layer.

4. A method as claimed in claim 1 for forming a bottom gate thin film transistor, wherein the first electrode pattern defines a gate electrode, the gate insulator layer being provided over the first electrode pattern, and the semiconductor layer being provided over the gate insulator layer, the second electrode pattern defining source and drain electrodes over the semiconductor layer.

5. A method as claimed in claim 4, wherein the step of removing the unexposed negative resist and the underlying second electrode layer further includes removal of a portion of the semiconductor layer underlying the unexposed negative resist.

6. A method as claimed in claim 4, further comprising the step of forming an etch stop layer over the transistor body, the etch stop layer being patterned using the opaque layer of the first electrode layers to define an etch stop substantially aligned with the opaque layer, the removal of the second electrode layer underlying the unexposed negative resist resulting in a source and drain electrodes which overlie edge regions of the etch stop.

7. A method as claimed in claim 1 for forming a bottom gate thin film transistor, wherein the first electrode pattern defines a gate electrode, the gate insulator layer is provided over the first electrode pattern, the second electrode pattern defines source and drain electrodes over the gate insulator layer, and the semiconductor layer is provided over the second electrode pattern.

8. A method as claimed in claim 7, including providing a silicide layer over the second electrode pattern.

9. A method as claimed in claim 1 for forming a top gate thin film transistor, wherein the first electrode pattern defines spaced source and drain electrodes, the semiconductor layer is provided over the first electrode pattern, the gate insulator layer is provided over the semiconductor layer, and the second electrode pattern defines a gate electrode.

10. A method as claimed in claim 1 for forming a top gate thin film transistor, wherein the first electrode pattern is provided over the semiconductor layer, the gate insulator layer is provided over the first electrode pattern, and the second electrode pattern defines a gate electrode.

11. A method as claimed in claim 1, wherein the semiconductor layer comprises microcrystalline silicon.

* * * * *